United States Patent
Hsu et al.

(10) Patent No.: US 9,392,721 B2
(45) Date of Patent: Jul. 12, 2016

(54) SLIDING MECHANISM WITH LOCKING FUNCTION

(71) Applicant: JOCHU TECHNOLOGY CO., LTD., Hsinchu County (TW)

(72) Inventors: Kuo-Ming Hsu, Tainan (TW); Tzu-Chien Huang, New Taipei (TW); Hsin-Han Lee, Hsinchu (TW); You-Lun Wu, Taoyuan (TW)

(73) Assignee: JOCHU TECHNOLOGY CO., LTD., Hsinchu County (TW)

( * ) Notice: Subject to any disclaimer, the term of this patent is extended or adjusted under 35 U.S.C. 154(b) by 42 days.

(21) Appl. No.: 14/296,984

(22) Filed: Jun. 5, 2014

(65) Prior Publication Data

US 2015/0359123 A1    Dec. 10, 2015

(51) Int. Cl.
*A47B 88/04*     (2006.01)
*H05K 7/14*      (2006.01)
*A47B 88/12*     (2006.01)

(52) U.S. Cl.
CPC ............... *H05K 7/1489* (2013.01); *A47B 88/04* (2013.01); *A47B 88/0418* (2013.01); *A47B 88/0422* (2013.01); *A47B 88/12* (2013.01)

(58) Field of Classification Search
USPC ............. 248/298.1, 221.11, 222.11; 108/143, 108/137; 312/330.1, 332, 333, 334.1, 312/334.5, 334.8; 211/126.15, 162
See application file for complete search history.

(56) References Cited

U.S. PATENT DOCUMENTS

| | | | |
|---|---|---|---|
| 8,328,300 B2 * | 12/2012 | Yu et al. | 312/333 |
| 8,371,454 B2 * | 2/2013 | Chen et al. | 211/26 |
| 8,403,434 B2 * | 3/2013 | Yu et al. | 312/334.1 |
| 2008/0122333 A1 * | 5/2008 | Tseng et al. | 312/333 |
| 2009/0167127 A1 * | 7/2009 | Chen et al. | 312/334.1 |
| 2009/0294393 A1 | 12/2009 | Chen et al. | |
| 2010/0072153 A1 | 3/2010 | Chen et al. | |
| 2012/0076446 A1 | 3/2012 | Chen et al. | |
| 2013/0082019 A1 * | 4/2013 | Fan | 211/162 |
| 2013/0119215 A1 | 5/2013 | Chen et al. | |
| 2014/0070064 A1 | 3/2014 | Chen et al. | |
| 2014/0265786 A1 * | 9/2014 | Chen et al. | 312/334.1 |
| 2014/0339975 A1 * | 11/2014 | Fan et al. | 312/334.1 |

* cited by examiner

*Primary Examiner* — Alfred J Wujciak
(74) *Attorney, Agent, or Firm* — Rabin & Berdo, P.C.

(57) ABSTRACT

A sliding mechanism with locking function includes a slide frame and a resilient plate. The slide frame includes opposite front and rear ends and an end plate formed at the front end and extending outward from the front end in a transverse direction relative to a longitudinal length of the slide frame. The end plate is formed with a through hole. The resilient plate has a width smaller than that of the slide frame, a rear section fixed to the slide frame and a front section opposite to the rear section and formed with a locking element exposed to an exterior of the through hole in the end plate in such a manner that the locking element is movable limitedly and resiliently in the transverse direction upon an external force applied thereto.

3 Claims, 5 Drawing Sheets

SLIDING MECHANISM WITH LOCKING FUNCTION

BACKGROUND OF THE INVENTION

1. Field of the Invention

The present invention relates generally to a sliding mechanism, and more particularly to a sliding mechanism with a locking function by the use of which, a server can be installed easily to a personal computer or dismantle from the PC, thereby facilitating the repairer or user.

2. The Prior Arts

In a personal computer (PC), a server is mounted slidably to a computer casing via a sliding mechanism, which is generally inserted into a pair of slide channels in the computer body. In case of repairing, the server can be pulled outward from the casing and after the repairing the server is pushed slidably back into the casing. A conventional sliding mechanism used in a PC generally includes an exterior plate, an interior plate and sometimes an intermediate plate between the exterior and interior plates in order to increase a total traveling length of the sliding mechanism. In some cases, the exterior plates are fixed securely to two opposite sides of the computer casing while the interior plates are used for carrying the server thereon.

To install a server within a PC, the server is firstly mounted on a pair of interior plates, which, in turn, are slidably mounted into a pair of exterior plate. Afterward, the exterior plates are inserted slidably into the slide channel of the computer casing. Note that after the exterior plates are fully inserted into the slide channel of the computer casing, a locking device (generally consisting of a resilient stick and an engaging hook) is used for securely retaining the exterior plates within the casing, thereby preventing untimely removal of the server from the casing. In case of repairing, the resilient stick is manipulated in such a manner to release engagement between the engaging hook and the casing, thereby permitting outward withdrawal of the exterior plates from the casing, hence the server is exposed to an exterior of the casing for undergoing repairing. It is noted that in case of a great impact applied on the conventional sliding mechanism at this time, ruin of the sliding mechanism will be resulted since the plates cannot withstand the great impact.

Taiwanese Patent Publication No. 201306721 discloses a sliding mechanism consisting of a support frame having an end plate formed with a through hole, an exterior plate mounted slidably on the support frame, a securing member and an engagement member. The exterior plate includes a plate body and a folded piece bent relative to the plate body. The securing member is mounted on the folded piece, and extends through the through hole within the end plate to engage the exterior plate so as to prevent movement of the exterior plate in a plane of the folded piece. The engagement member includes a resilient connection rod having one end fixed to the plate body and an engagement strip having first and second engaging parts engaging the end plate so as to prevent the exterior plate from moving in the direction perpendicular to the end plate. For removal, the resilient connection rod can be easily manipulated in such a manner to disengage the engaging parts from the end plate, thereby permitting withdrawal of the exterior plate outward from the casing.

One drawback of the above sliding mechanisms resides in that the structure is relatively complicated owing to too many components and hence results in high manufacturing expense. In addition, the resilient connection rod may deform permanently if an external force applied thereon is too heavy during the removal of the exterior plate from the casing.

SUMMARY OF THE INVENTION

A primary objective of the present invention is to provide a sliding mechanism with locking function, which is simple in structure, which can be produced at low manufacturing cost, and which is not easily damaged or ruined in case of great impact applied thereto.

One specific feature of the present invention is to provide a resilient plate on a slide frame. The resilient plate preferably includes a locking element that extends through a through hole in an end plate formed at one end of the slide frame for engaging the periphery defining a fixing hole in a computer casing. Since a transverse movement of the locking element relative to a longitudinal length of the slide frame is restricted by two opposite sides of the through hole in the end plate, the repairer or the user does not need to apply a relatively large external force on the locking element during removal of the slide frame from the computer casing. In other words, the resilient plate is not easily deformed owing to the relatively large external force applied thereon.

A slide mechanism with locking function of the present invention includes a slide frame and a resilient plate. The slide frame includes opposite front and rear ends and an end plate formed at the front end and extending outward from the front end in a transverse direction relative to a longitudinal length of the slide frame. The end plate is formed with a through hole. The resilient plate has a width smaller than that of the slide frame, a rear section fixed to the slide frame and a front section opposite to the rear section and formed with a locking element exposed to an exterior of the through hole in the end plate in such a manner that the locking element is movable limitedly and resiliently in the transverse direction upon an external force applied thereto.

In order to simplify the structure and lower the manufacturing expense, the end plate is formed by partially bending the front end of the slide frame such that the end plate extends perpendicularly from the front end. The through hole in the end plate defines an axis extending parallel to the longitudinal length of the slide frame.

The sliding mechanism of the present invention further includes at least one securing element for securing the end plate relative to a compute casing once the slide plate mounted within the computer casing.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
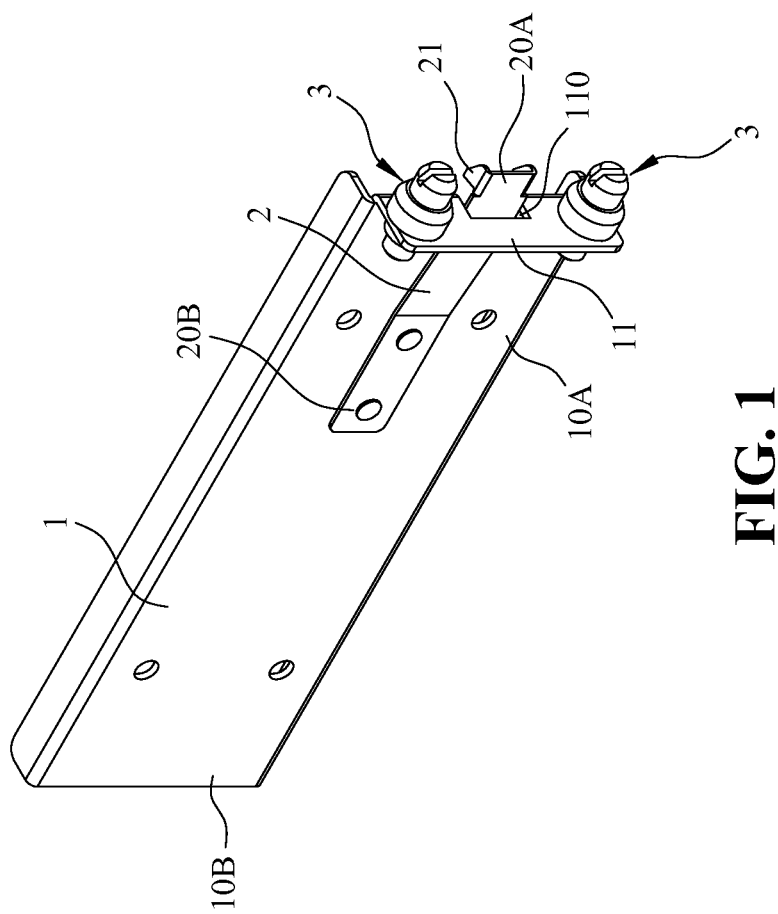
FIG. 1 is a perspective view of a slide mechanism of the present invention with a lock function.
Figure 2:
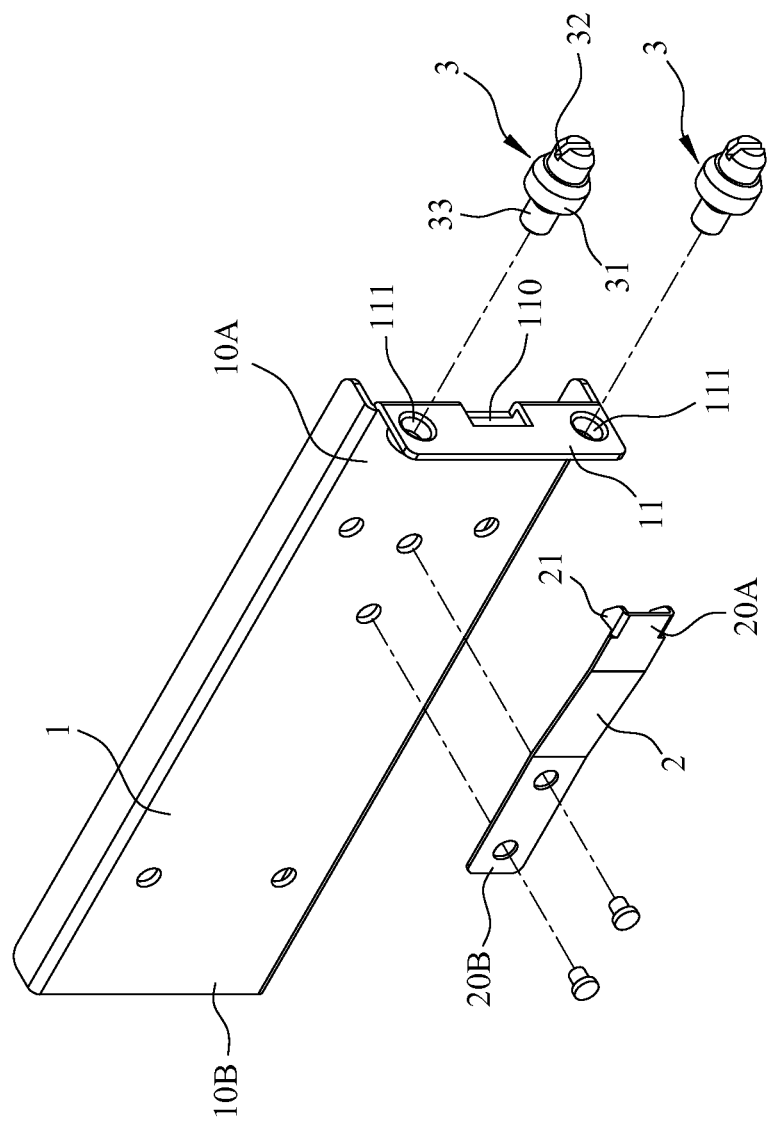
FIG. 2 is a partly exploded view the slide mechanism of the present invention with the lock function.

Referring to FIGS. 1 and 2, wherein FIG. 1 is a perspective view of a slide mechanism of the present invention with a lock function and FIG. 2 is partly exploded view the slide mechanism of the present invention with the lock function. As illustrated, the sliding mechanism of the present invention includes a slide frame 1 and a resilient plate 2. In this embodiment, the slide frame 1 serves the exterior plate since the same is inserted slidably into a slide channel of a computer casing 4 (see FIG. 3). The slide mechanism of the present invention further includes a pair of interior plates (not visible) which carry a server thereon and which are slidably inserted into the exterior plates and a pair of intermediate plates (not visible) between the exterior and interior plates in order to increase a total traveling length of the sliding mechanism.

The slide frame 1 in fact is an elongated frame, includes opposite front and rear ends 10A, 10B and an end plate 11 formed at the front end 10A and extending outward from the front end 10A in a transverse direction relative to a longitudinal length of the slide frame 1. The end plate 11 is formed with a through hole 110. In order to economize the manufacturing expense, the end plate 11 is formed by partially bending the front end thereof such that the end plate 11 extends perpendicularly from the front end, the through hole defining an axis extending parallel to the longitudinal length of the slide frame 1. Preferably, the through hole 110 is generally rectangle with upper and lower sides. The end plate 11 is further formed two circular holes 111 respectively proximate to the upper and lower sides thereof, the purpose of which will be explained in the following paragraphs. Each circular hole 111 defines an axis extending parallel to the longitudinal length of the slide frame 1.

The resilient plate 2 has a width smaller than that of the slide frame 1, a rear section 20B fixed to the slide frame 1 via rivets and a front section 20A opposite to the rear section 20B and formed with a locking element 21 exposed to an exterior of the through hole 110 in the end plate 11 in such a manner that the locking element 21 is movable limitedly and resiliently in the transverse direction upon an external force applied thereto. In this embodiment, the locking element 21 includes two hooks mounted to the front section 20A via rivets such after mounting the front section 20A extends through the hole 110 in the end plate 11 and thus the hooks are exposed to the exterior of the end plate 11. Note that after assembly, the front section 20A of the resilient plate 2 is movable within the hole 110 in a transverse direction of the longitudinal length of the slide frame 1. Transverse movement of the front section 20A is restricted by the width (measured between left and right sides) of the hole 110 such that the resilient plate 2 is not easily deformed even if a great impact is applied accidentally thereon during removal of the server from the computer casing.

Figure 3:
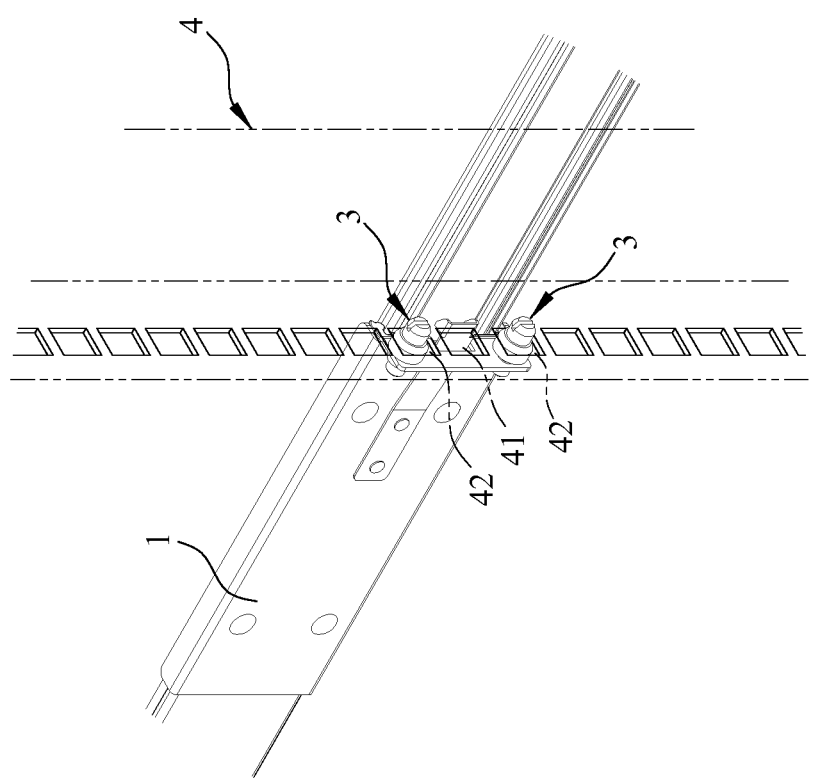
FIG. 3 illustrates the slide mechanism of the present invention mounted to a personal computer for installation of a server therein.

The slide mechanism of the present invention further includes a pair of securing elements 3 made from elastic materials, each includes an intermediate cylindrical portion 31, a rear cylindrical portion 33 with diameter smaller than the intermediate cylindrical portion 31 press-fitted into a respective circular hole 111 in the end plate 11 so as expose the intermediate cylindrical portion 31 from the end plate 11, an intermediate cylindrical portion 31 having a diameter for matching with a mounting hole 42 in the flange 41 of the computer casing (see FIG. 3). A front cylindrical portion 32 is used to enable the rear cylindrical portion 33 to be in conjunction with the circular hole 111.

Figure 4:
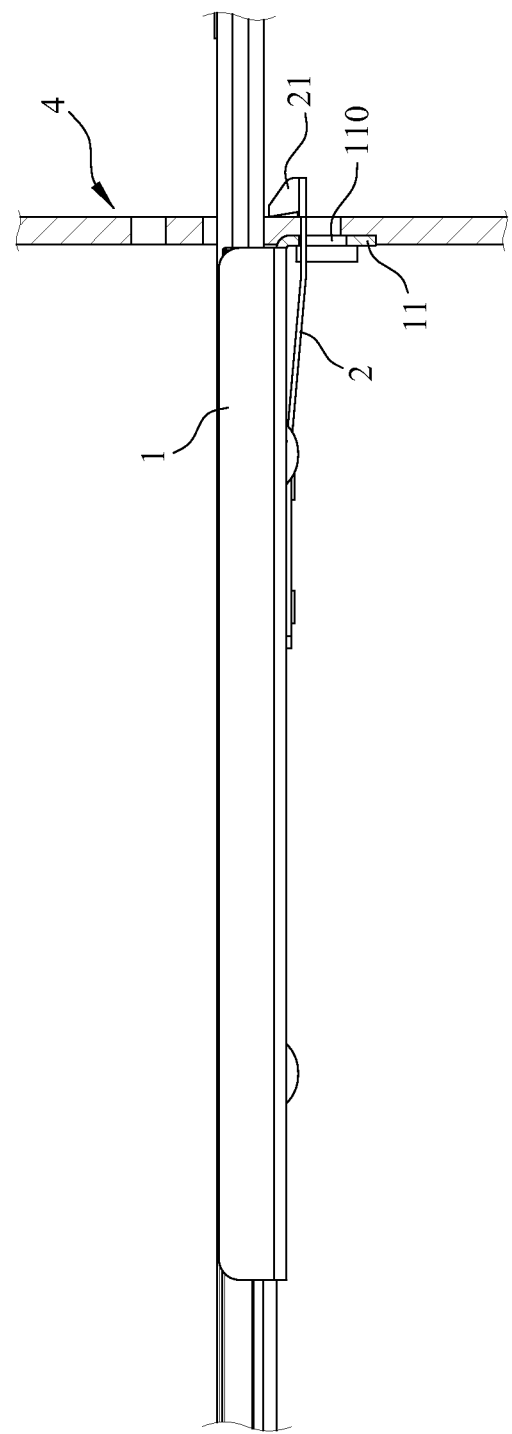
FIG. 4 is a planar view illustrating how a locking element of the slide mechanism of the present invention engages a computer body after assembly.

Referring to FIG. 3, after the server (not visible) is mounted to two interior plates, the latter plates are inserted slidably into two slide frames 1 of the present invention. Afterward, the assembly constituted by two interior plates, two side frames 1 and the server is inserted into the computer casing 4 by press-fitting the intermediate cylindrical portion 31 of the securing elements 3 within the corresponding mounting hole 42 in the flange 41 of the computer casing 4, where the locking element 21 extends through and thus engages the periphery defining a fixing hole 41 formed through the flange 41 of the casing 4 between two adjacent mounting holes 42, thereby preventing the slide frames 1 from being pulled outward from the casing 4 (see FIG. 4), In other words, the slide frames 1 are retained stably within the casing 4.

Figure 5:
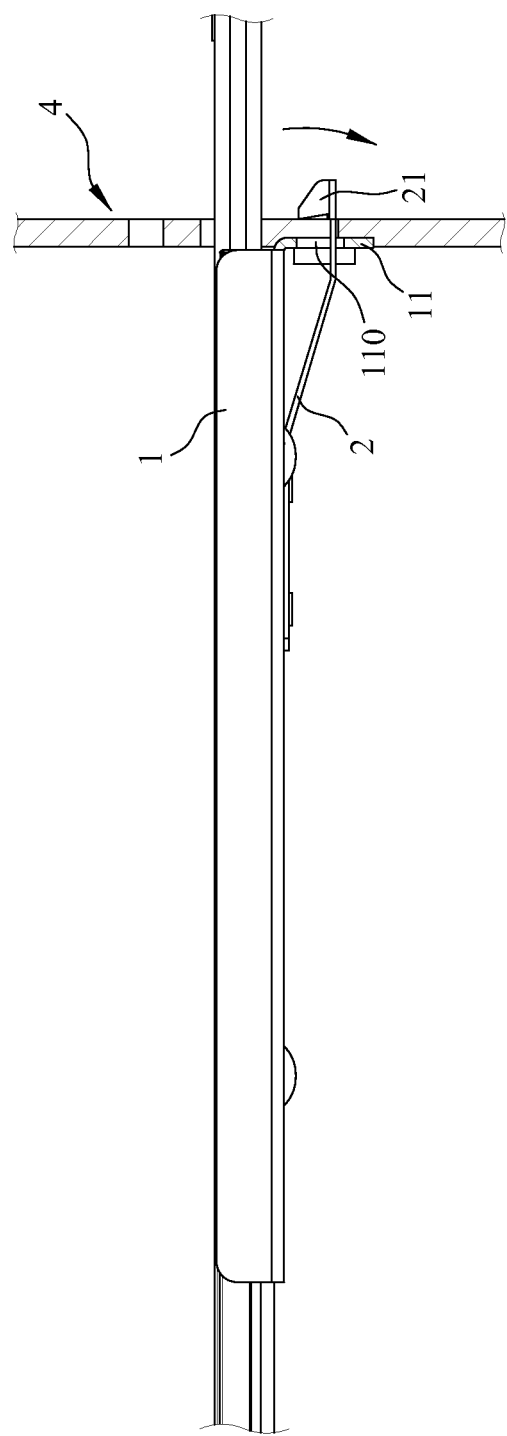
FIG. 5 is a planar view illustrating how a locking element of the slide mechanism of the present invention disengages a computer body during removal of a server from the computer body.

Referring to FIG. 5, in case of replacing the server back into the computer casing 4 or disassembling the server from the casing for repairing, the locking element 21 can be pulled outward in the transverse direction of the longitudinal length of the slide frame 1 so as to disengage the locking element 21 from the fixing hole 41, where the slide frames 1 can be pulled outward from the casing 4. Note that movement of the locking element 21 within the hole 110 is restricted by the width thereof, the repairer or the user needs not apply a relatively large external force to cause transverse movement of the locking element 21 relative to the slide frames 1.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A sliding mechanism with locking function mounted on a server for supporting a computer, comprising:
   a slide frame including opposite front and rear ends and an end plate formed at said front end and extending outward from said front end in a transverse direction relative to a longitudinal length of said slide frame, said end plate being formed with a through hole;
   a single resilient plate having a width smaller than that of said slide frame, a rear section fixed to said slide frame, and a front section opposite to said rear section and formed with a locking element exposed to an exterior of said through hole in said end plate in such a manner that said locking element is movable limitedly and resiliently in said transverse direction upon an external force applied thereto, said locking element comprising two hooks which project in the opposed transverse direction of the end plate; and
   at least one securing element having a front cylindrical portion, a rear cylindrical portion, and an intermediate cylindrical portion disposed between the front cylindrical portion and the rear cylindrical portion, the intermediate cylindrical portion having a first diameter, and being disposed at a front surface of said end plate, the front cylindrical portion having a second diameter smaller than the first diameter, and being disposed in front of said intermediate cylindrical portion, the rear cylindrical portion being inserted through the front surface of the end plate.

2. The sliding mechanism according to claim 1, wherein said end plate is formed by partially bending said front end thereof such that said end plate extends perpendicularly from said front end, said through hole defining an axis extending parallel to the longitudinal length of the slide frame.

3. The sliding mechanism according to claim 2, wherein the at least one securing element is for securing said end plate relative to a mounted body.

\* \* \* \* \*